(12) United States Patent
Hiebel

(10) Patent No.: US 7,759,944 B2
(45) Date of Patent: Jul. 20, 2010

(54) METHOD FOR VERIFYING THE CALIBRATION OF A MULTIPORT NETWORK ANALYZER AND CORRESPONDING CALIBRATION UNIT

(75) Inventor: Michael Hiebel, Fuerstenfeldbruck (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 415 days.

(21) Appl. No.: 11/662,692

(22) PCT Filed: Sep. 20, 2005

(86) PCT No.: PCT/EP2005/010144

§ 371 (c)(1),
(2), (4) Date: Sep. 12, 2007

(87) PCT Pub. No.: WO2006/034801

PCT Pub. Date: Apr. 6, 2006

(65) Prior Publication Data

US 2008/0018342 A1  Jan. 24, 2008

(30) Foreign Application Priority Data

Sep. 29, 2004  (DE) ........................ 10 2004 047 308

(51) Int. Cl.
*G01R 35/00* (2006.01)
*G01R 31/28* (2006.01)
(52) U.S. Cl. .................................... 324/601; 324/158.1
(58) Field of Classification Search .................. 324/601, 324/158.1
See application file for complete search history.

(56) References Cited

U.S. PATENT DOCUMENTS

| 5,332,974 A | 7/1994 | Harkins et al. |
| 5,578,932 A | 11/1996 | Adamian |
| 5,587,934 A | 12/1996 | Oldfield et al. |
| 5,715,183 A | 2/1998 | Grace et al. |
| 6,570,397 B2 * | 5/2003 | Mayder et al. ............... 324/754 |

FOREIGN PATENT DOCUMENTS

EP  0 430 475 A2  6/1991

(Continued)

OTHER PUBLICATIONS

Agilent Technologies—Agilent Measurement Solutions for Balanced Components; XP-002359636; May 2002; pp. 1-12.

(Continued)

*Primary Examiner*—Amy He
(74) *Attorney, Agent, or Firm*—Marshall, Gerstein & Borun LLP

(57) ABSTRACT

The described method and calibration unit are used to verify the calibration of a multiport network analyzer which uses a calibration unit for calibration, the unit having a plurality of calibration ports corresponding to the number of measuring ports of the network analyzer, whereby different calibration standards, especially idle, short-circuit, adaptation or through-connection stands can be connected to the calibration ports. According to the inventive method, the calibration ports of the calibration unit art interchanged with the measuring ports of the network analyzer in such a manner that one calibration standard of the calibration unit each which is different from the one used in the previous calibration process is connected to every measuring port of the network analyzer.

4 Claims, 2 Drawing Sheets

FOREIGN PATENT DOCUMENTS

| | | |
|---|---|---|
| EP | 0 626 588 A1 | 11/1994 |
| JP | 11211766 A | 8/1999 |

OTHER PUBLICATIONS

Agilent Technologies—User's and Service Guide; XP-002359637; Part No. 87050-90026; Print Date: Mar. 2004; pp. 4-69-4-77.

International Preliminary Examination Report (English translation)—PCT/EP2005/010144; Original German report completed: Jan. 22, 2007.

International Search Report—PCT/EP2005/010144; Date of Mailing: Jan. 5, 2006.

* cited by examiner

METHOD FOR VERIFYING THE CALIBRATION OF A MULTIPORT NETWORK ANALYZER AND CORRESPONDING CALIBRATION UNIT

BACKGROUND OF THE INVENTION

1. Field of the Invention

The invention relates to a method for verifying the calibration of a multi-port network analyzer and to a calibration unit.

2. Related Technology

Before implementing a measurement of the transmission and reflection coefficients of a device under test, vectorial network analyzers must first be calibrated. In this context, coefficient measurements, from which error terms are calculated, with which system corrections can be implemented in the actual measurement of the device under test, are carried out using three or more known, mutually-different calibration standards. For example, Open, Short, Match, or Through standards, which are connected in succession to the measurement ports, are used as calibration standards. It is already known, that these calibration standards can be formed, for example, on a substrate and arranged in the interior of a housing, from which respective cable connections project laterally. For the calibration, a calibration unit of this kind with calibration standards of fixed dimensions is connected via jacks and cables to the corresponding measurement ports of the network analyzer. The calibration procedure can then be implemented automatically under computer control.

It is also known from U.S. Pat. No. 5,578,932, that calibration standards of this kind can be realized as switchable complex impedances and that the various different calibration standards can be realized by switching.

After the calibration of the network analyzer has been completed, it is appropriate to implement a verification of the calibration. In practice, so-called T-checkers, which are connected to the measurement ports and with which corresponding coefficient measurements can then be implemented, are used for this purpose. For network analyzers with more than two measurement ports, the use of T-checkers of this kind is very awkward and susceptible to error because of the many screw connections required and the associated possibility of connection errors. In the case of two-port network analyzers using switchable impedances for the calibration, it is known from U.S. Pat. No. 5,578,932, that the same standards can be used for the verification as for the calibration. However, in this context, cabling errors (interchanged connections or faulty electrical connections at the jacks) cannot be detected, although these faults occur very frequently in practice. According to the known method, a complete verification is not possible, because the jacks are not detached during the transition from calibration to verification.

SUMMARY OF THE INVENTION

The invention provides a method for the complete verification of the calibration of a multi-port network analyzer. The invention also provides a calibration unit appropriate for this purpose, which allows a simple implementation of this method.

This invention provides a method for verifying the calibration of a multi-port network analyzer by measuring the transmission coefficients and/or reflection coefficients of several verification standards connected to measurement ports of the network analyzer, wherein a calibration unit is used for the calibration, the calibrating unit providing a number of calibration ports corresponding to the number of measurement ports of the network analyzer, to which respectively different calibration standards, are connected, comprising using the calibration standards of the calibration unit previously used for the calibration as verification standards, and for verification, by contrast with the preceding calibration, interchanging the connections of the calibration ports of the calibration unit with the measurement ports of the network analyzer in such a manner that a respectively different calibration standard of the calibration unit is connected to each measurement port of the network analyzer The invention also provides a calibration unit for a four-port network analyzer using a calibration unit with a housing, from which two calibration-port connections project laterally from respectively opposing first and second sides, comprising for the calibration positioning the housing with its upper side at the top, and connecting the two connections projecting from the first side to a first cable pair of the network analyzer, and connecting the two connections projecting from the second side to a second cable pair of the network analyzer; while for the verification, rotational and positional the housing with its upper side at the bottom, and the two connections projecting from the second side are connected to the first cable pair of the network analyzer, and the two connections projecting from the first side are connected to the second cable pair of the network analyzer, and that the first or second cable pair is interchanged in this context According to the invention, the same calibration unit is used for the verification as was used for the preceding calibration, wherein it is merely necessary, to interchange the connections of the connecting cable leading to the network analyzer in such a manner that a different calibration standard of the calibration unit is connected to each measurement port of the network analyzer by contrast with the preceding calibration, for example, respectively, a different open, a different short, a different match and a different through standard. With the method according to the invention, the jack connections previously used for the calibration must be completely detached for the verification and reconnected after the rotation of the calibration unit; accordingly, cabling errors, such as interchanged connections or faulty electrical connections at the jacks are also detected in the verification. With the method according to the invention, it is therefore possible for the first time to provide a complete verification of a preceding calibration of a multi-port network analyzer, because the method detects not only errors in the calibration standards used but also faults of the jacks and cabling faults; in other words, all parameters up to the actual reference level of the network analyzer.

The method according to the invention is particularly suitable for network analyzers with three or more ports. A particularly-simple, compact calibration unit is also obtained for a four-port network analyzer, in which the calibration ports project laterally respectively in pairs from the housing, and the calibration unit is merely rotated for the verification and the connecting cables are then reconnected from the same sides to the network analyzer. These connections need only be interchanged on one side (exemplary embodiment according to FIGS. 6 and 7). A calibration unit of this kind could also be meaningfully used for the verification of a two-port network analyzer, by using two opposing connections for the calibration and the two other opposing connections for the verification. The method according to the invention is also suitable for network analyzers with more than four measurement ports, for example, with an eight-port network analyzer; the calibration unit used in this context then provides, for example, a different geometry appropriate for this purpose; for example, the housing may be five-sided, six-sided or eight-sided.

The invention is described in greater detail below with reference to schematic drawings of exemplary embodiments of a four-port network analyzer.

DETAILED DESCRIPTION

Figure 1:
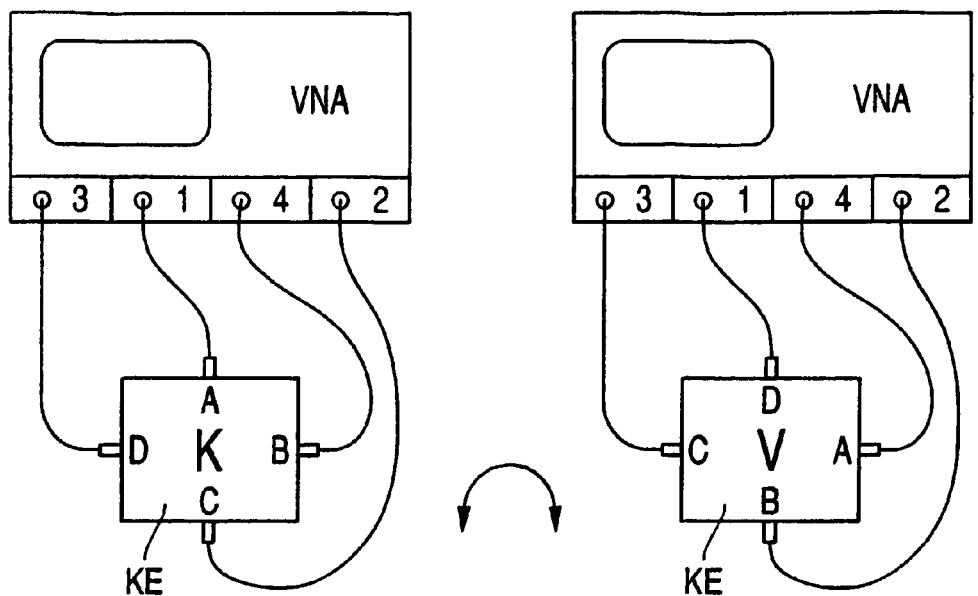
FIG. 1 shows a vectorial network analyzer and a calibration unit.

FIG. 1 shows schematically a vectorial network analyzer VNA with four measurement ports 1, 2, 3, and 4, which, for the calibration, are connected via cables to the connections A, B, C and D of a calibration unit KE. These connections A to D, which are designed, for example, as jacks projecting externally from a housing E, are connected in the interior of the housing to calibration standards, which are not described in greater detail. Each connection A to D can be connected via electronic switches either to an open, a short, a match or through standard leading to the other connections.

These electronic switches are controlled by the network analyzer VNA according to a specified calibration program via a control connection, not illustrated here. The network analyzer VNA is calibrated by the controlled, successive connection of these calibration standards to the four calibration connections A to D; the error-correction data required for subsequent measurement of the device under test are determined from the calibration data and stored in the network analyzer.

The same standards are used as verification standards for the subsequent verification of the calibration of the network analyzer as were previously used for the calibration. This is possible, if these standards are interchanged in such a manner that a different calibration standard is connected to each measurement port of the network analyzer for the verification by contrast with the preceding calibration and, in fact, for example, a respectively-different open, a different short, a different match and a different one of the total of six possible through standards. According to the invention, this is achieved simply by interchanging the calibration ports A to D. For this purpose, dependent upon the number N of measurement ports of the network analyzer or respectively connections of the calibration unit KE, there are a total of ½·N·(N−1) permutations. For a four-port network analyzer and a calibration unit KE with four calibration connections A to D, there are therefore a total of six permutations, wherein FIG. 1 provides a first permutation by rotating the calibration unit KE in a clockwise direction. FIGS. 2 to 5 show four further permutations, wherein a rotation of the calibration unit about reflection axes S is permitted.

According to FIG. 1, for the verification V, the four connections of the calibration ports A to D are detached, and the calibration unit is then rotated in the clockwise direction from the calibration position K into the verification position V. The connections 1 to 4 of the network analyzer VNA are then reconnected in the former distribution to the connections A to D. The location of the connecting cables between the network analyzer and the calibration unit remains the same in the calibration position K and also in the verification position V, so that no errors occur as a result of different bending radii or other effective electrical lengths of the cables. The same could also be achieved by rotating the calibration unit in the anticlockwise direction or by rotating to the left or to the right by more than one calibration port (for example, by three ports) (second permutation).

Figures 2, 3, 4, 5:
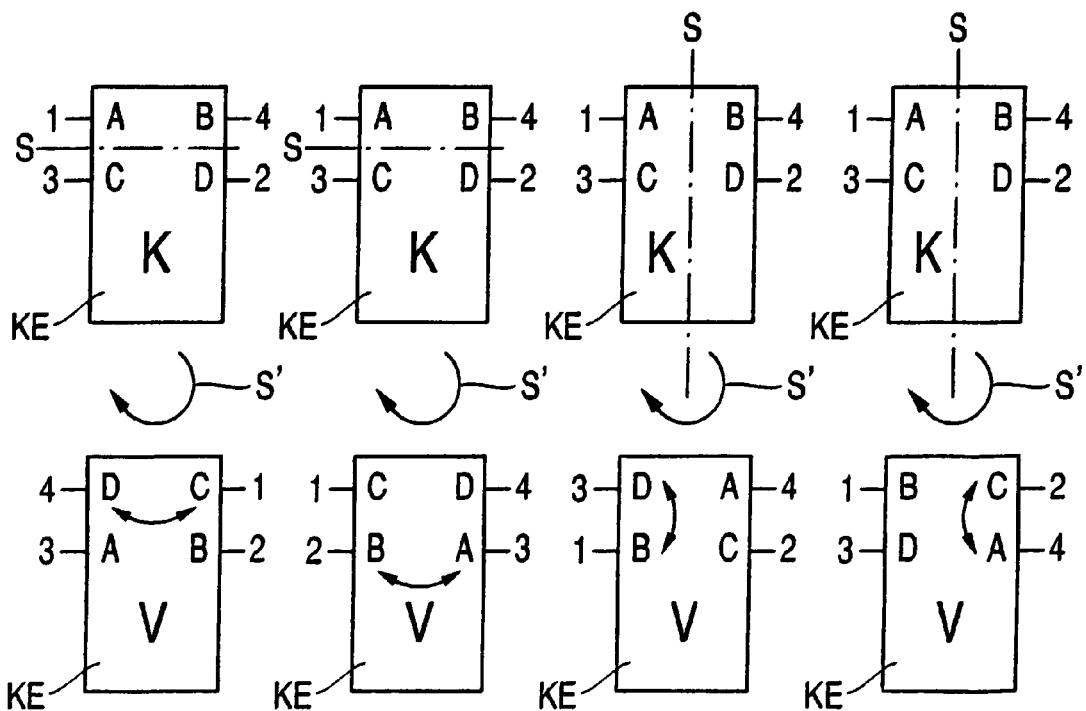
FIGS. 2-7 show the calibration unit in different configurations for calibration and verification.

The four other possibilities for connecting different calibration standards to the measurement ports of the network analyzer by rotating the calibration unit KE for the verification, as shown in FIGS. 2 to 5, are obtained by reflection of the calibration connections A to D and rotation about the reflection axis S (indicated by the rotation arrows S') and subsequently interchanging the connections of one of the connection pairs. In FIG. 2, the calibration unit is rotated from position K into position V, and the connections D and C interchanged. In the exemplary embodiment according to FIG. 3, only connections A and B are interchanged after the rotation. In FIGS. 4 and 5, the connections D and B are interchanged once after the rotation, and on the other occasion, the connections A and C are interchanged, as indicated respectively by the double arrows. In this context, the cable connections with the network analyzer indicated by the reference numbers 1 to 4 remain largely unchanged.

Figure 6:
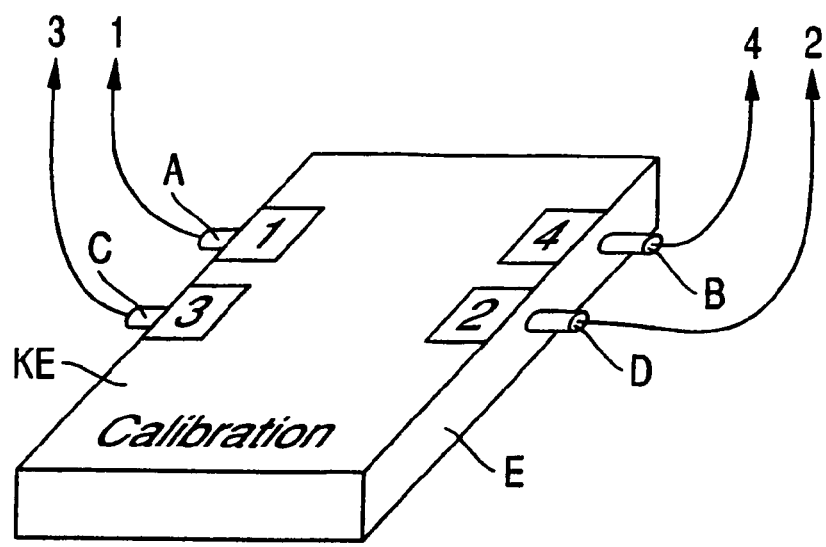
Figure 7:
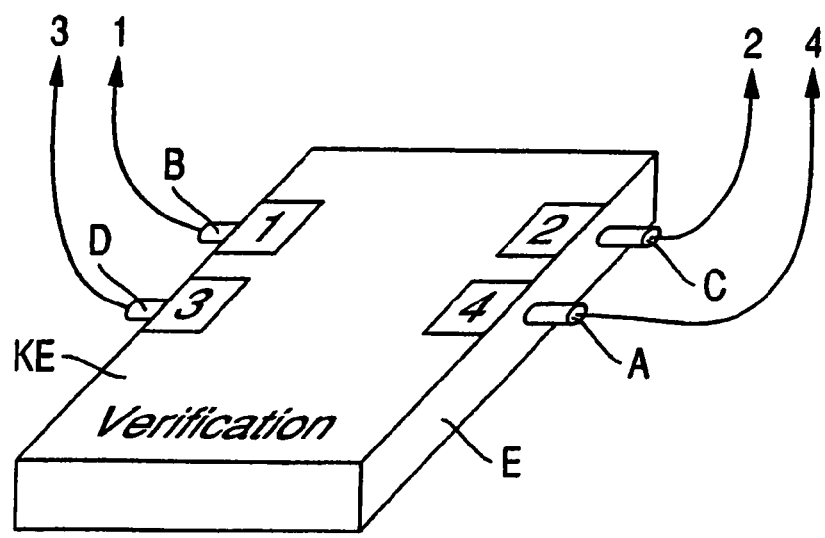

FIG. 5 shows a particularly suitable arrangement, details of which are illustrated in FIGS. 6 and 7. In this exemplary embodiment according to FIGS. 6 and 7, the calibration unit includes a rectangular housing E, wherein, in the position according to FIG. 6, the two connections A and C project laterally on the left-hand side, and the two connections B and D project laterally on the right-hand side. On the upper side, in the position according to FIG. 6, the housing E bears the lettering "Calibration", and, with the cable allocation, as also used in FIG. 5, the connections A to D are marked on the upper side with 1, 2, 3, and 4.

For the verification, the calibration unit KE is rotated from the position according to FIG. 6 into the position according to FIG. 7, so that the rear side comes to be disposed at the top. On the original rear side, the calibration unit is marked with "Verification" and once again with the reference numbers 1 to 4 for the connection of the associated connecting cables, wherein, in this rotated position, the connections A and C now project from the right-hand side, and the connections B and D now project from the left-hand side of the housing E.

As a result of the lettering on the front side and rear side of the calibration unit KE, the user can switch from calibration to verification without error. It is merely necessary to detach all the connections A to D, to rotate the calibration unit and then to reconnect the cables again in the marked sequence, wherein the connections on the left-hand side in the example remain unchanged, and the connections on the right-hand side are interchanged. The interchanging of the connections can also be implemented on the left-hand side, wherein the connections on the right-hand side then remained unchanged. In this context also, the connecting cables between the network analyzer and the calibration unit remained substantially the same, thereby avoiding the risk of measuring error resulting from a change in the bending radii and effective length of the cables even in the case of higher frequencies.

It is not necessary to connect all calibration standards for the verification; dependent upon the subsequent measuring task for the VNA, it is often sufficient to connect only some of the OSMT standards, for example, only reflection standards without pressure connections. The last-named special case would be associated with additional degrees of freedom in the choice of the permutation. The interchanging of the connections A and C in FIG. 5 may not be required, because the through standards need not be taken into consideration.

The invention claimed is:

1. Method for verifying the calibration of a multi-port network analyzer by measuring at least one of the transmission coefficients and reflection coefficients of several verification standards connected to measurement ports of the network analyzer, wherein a calibration unit is used for the calibration, the calibration unit providing a number of calibration ports corresponding to the number of measurement ports of the network analyzer, to which respectively different calibration standards, are connected, the method comprising the steps of:
using the calibration standards of the calibration unit previously used for the calibration as verification standards, and for verification, by contrast with the preceding calibration, interchanging the connections of the calibration ports of the calibration unit with the measurement ports of the network analyzer in such a manner that a respectively different calibration standard of the calibration unit is connected to each measurement port of the network analyzer.

2. Method according to claim 1 for a four-port network analyzer (VNA), wherein a calibration unit (KE) with four calibration ports projecting laterally from a housing (E) accommodating the calibration standards is used for the calibration, comprising,
in order to interchange the connections of the calibration ports with the measurement ports for the verification, merely rotating the housing (E) with the calibration ports projecting therefrom.

3. Method according to claim 2 for a four-port network analyzer using a calibration unit with a housing, from which two calibration-port connections project laterally from respectively opposing first and second sides comprising,
for the calibration, positioning the housing with its upper side at the top, and connecting the two connections projecting from the first side to a first cable pair of the network analyzer, and connecting the two connections projecting from the second side to a second cable pair of the network analyzer; while for verification, rotating and positioning the housing with its upper side at the bottom, and the two connections projecting from the second side are connected to the first cable pair of the network analyzer, and the two connections projecting from the first side are connected to the second cable pair (2, 4) of the network analyzer (VNA), and that the first or second cable pair is interchanged.

4. Calibration unit for the implementation of a method for verifying the calibration of a multi-port network analyzer by measuring at least one of the transmission coefficients and reflection coefficients of several verification standards connected to measurement ports of the network analyzer, the method comprising:

using the calibration standards of the calibration unit previously used for the calibration as verification standards, and for verification, by contrast with the preceding calibration, interchanging the connections of the calibration ports of the calibration unit with the measurement ports of the network analyzer in such a manner that a respectively different calibration standard of the calibration unit is connected to each measurement port of the network analyzer, the calibration unit for the implementation of the method, with a housing, from which a number of calibration-port connections corresponding to the number of measurement ports of the network analyzer project laterally, to which calibration standards disposed in the interior of the housing can be connected and disconnected via switching elements according to a specified control program, wherein,
on an exterior of the housing, allocated to the calibration-port connections projecting laterally from it, lettering is provided for the connection of the connecting cable of the network analyzer to the calibration-port connections optionally for calibration or verification.

* * * * *